(12) United States Patent
Liao et al.

(10) Patent No.: US 7,777,555 B2
(45) Date of Patent: Aug. 17, 2010

(54) TEMPERATURE COMPENSATING CIRCUIT AND METHOD

(75) Inventors: Chun-Yao Liao, Hsinchu (TW); Guan-Xing Huang, Hsinchu (TW); J-Ian Wu, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 0 days.

(21) Appl. No.: 12/360,416

(22) Filed: Jan. 27, 2009

(65) Prior Publication Data
US 2010/0066434 A1  Mar. 18, 2010

(30) Foreign Application Priority Data
Sep. 18, 2008  (TW) .............................. 97135878 A

(51) Int. Cl.
*H01L 35/00* (2006.01)
(52) U.S. Cl. .......................... 327/513; 327/543; 331/66
(58) Field of Classification Search ................. 327/513, 327/538, 539, 541, 543; 331/57, 65, 66
See application file for complete search history.

(56) References Cited

U.S. PATENT DOCUMENTS

| | | | | |
|---|---|---|---|---|
| 4,430,008 A | * | 2/1984 | Nishikubo | ................... 368/202 |
| 4,461,992 A | * | 7/1984 | Yamaguchi et al. | ......... 323/313 |
| 5,311,476 A | * | 5/1994 | Kajimoto et al. | ............. 365/222 |
| 5,499,214 A | * | 3/1996 | Mori et al. | ................... 365/222 |
| 5,600,281 A | * | 2/1997 | Mori et al. | ...................... 331/57 |
| 7,026,882 B2 | * | 4/2006 | Ganivet et al. | .............. 331/143 |
| 7,315,221 B2 | * | 1/2008 | Ha et al. | ...................... 331/176 |
| 7,411,441 B2 | * | 8/2008 | Rashid | ........................ 327/538 |
| 7,541,862 B2 | * | 6/2009 | Fujisawa et al. | ............. 327/539 |
| 7,583,061 B2 | * | 9/2009 | Lu et al. | ...................... 320/141 |
| 2007/0132506 A1 | * | 6/2007 | Fujisawa et al. | ............. 327/539 |

* cited by examiner

*Primary Examiner*—Lincoln Donovan
*Assistant Examiner*—William Hernandez
(74) *Attorney, Agent, or Firm*—Volpe and Koenig PC

(57) ABSTRACT

A temperature compensating circuit including a reference circuit, a transistor and a first circuit is provided. The reference circuit has a reference current and a resistance circuit, wherein the resistance circuit includes a first terminal receiving the reference current, a second terminal and a negative-temperature-coefficient resistor. The transistor has a drain, a source and a path disposed between the drain and the source, wherein the path of the transistor is connected in series with the resistance circuit, a gate of the transistor is electrically connected to the drain of the transistor and the second terminal of the resistance circuit, and the drain of the transistor produces a bias-voltage signal. The first circuit produces an output signal having a variable frequency in response to the bias-voltage signal, wherein the temperature compensating circuit utilizes the negative-temperature-coefficient resistor to compensate the variable frequency for a temperature change in the temperature compensating circuit.

20 Claims, 8 Drawing Sheets

TEMPERATURE COMPENSATING CIRCUIT AND METHOD

FIELD OF THE INVENTION

The present invention relates to a temperature compensating circuit and method, and more particularly to a temperature compensating circuit and method for compensating an oscillation frequency of an oscillator for a temperature change.

BACKGROUND OF THE INVENTION

An internal oscillator is usually used in the integrated circuit for providing a system clock. However, because the components and the wires in the internal oscillator all have temperature properties, the frequency of the internal oscillator changes once the operating temperature changes.

A ring oscillator is usually served as a constituent circuit of the internal oscillator. Because the MOS device has the property of the positive temperature coefficient in itself, the frequency of the ring oscillator has the following properties when the temperature changes. When the temperature increases, the frequency become lower because of an increment of the internal resistance of the MOS device. Conversely, when the temperature decreases, the frequency become faster.

Please refer to FIG. 1, which is a schematic diagram showing a conventional internal oscillator 10. As shown, the internal oscillator 10 includes a ring oscillator 12 and an output unit 13. The ring oscillator 12 includes odd-number stages of inverter circuits 121, 122, 123, ..., 128 and 129. An output terminal K9 of the ring oscillator 12 is electrically connected to an input terminal K0 of the inverter circuit 121, which causes an output signal $V_{A9}$ of the ring oscillator 12 to be fed back to the input terminal K0 of the inverter circuit 121. Besides, an input terminal KA of the inverter circuit 121 receives an enable signal EN.

An output signal $V_{A1}$ of the inverter circuit 121 has a delay and an inversion in comparison with the output signal $V_{A9}$ of the inverter circuit 129. An output signal $V_{A2}$ of the inverter circuit 122 has a delay and an inversion in comparison with the output signal $V_{A1}$ of the inverter circuit 121. Similar scheme is applicable to two output signals of every two adjacent stages. Therefore, the output signal $V_{A9}$ of the ring oscillator 12 has an oscillation frequency f1.

The output unit 13 includes two NOT gates connected in series, receives the output signal $V_{A9}$, and produces a clock signal CLK1, wherein the clock signal CLK1 may have the oscillation frequency f1 in an ideal state.

Please refer to FIG. 2(a), which is a schematic diagram showing another conventional internal oscillator 20. As shown, the internal oscillator 20 includes a reference circuit 21, a ring oscillator 22 and an output unit 23. The reference circuit 21 includes an NMOS transistor 211, a resistor R2 with a positive temperature coefficient, and a PMOS transistor 213. A gate G of the PMOS transistor 213 receives a control signal $V_{22}$, and a reference current $i_{21}$ flows through the PMOS transistor 213, the resistor R2 and the NMOS transistor 211.

The ring oscillator 22 includes odd-number stages of inverter circuits 221, 222, 223, ..., 228 and 229, and each (such as 221) of the inverter circuits 221, 222, 223, ..., 228 and 229 includes the same structure. The ring oscillator 22 produces an output signal $V_{B9}$ having an oscillation frequency f2. The inverter circuit 221 includes an NMOS transistor 2211, a PMOS transistor 2212 and a capacitor C21, and produces an output signal $V_{B1}$. The output signal $V_{B9}$ of the ring oscillator 22 is fed back to a gate of the PMOS transistor 2212. In order to achieve the required oscillation frequency f2 in a smaller amount of stages, a capacitor (e.g. C21) is added to each inverter (e.g. 221) for increasing a delay time between every two sequential stages of inverters.

The NMOS transistor 211 of the reference circuit 21 and an NMOS transistor (e.g. 2211) of each inverter (e.g. 221) constitute a current mirror. Therefore, plural currents $i_{21}, I_{B1}, I_{B2}, I_{B9}$ have a relation of $i_{21}=n*I_{B1}=n*I_{B2}=n*I_{B9}$, wherein n is a proportional coefficient. The reference circuit 21 controls a current (e.g. $I_{B1}$), flowing in the each inverter (e.g. 221), to reach that the current is less influenced from the voltage drift. Besides, the reference current source circuit 21 utilizes the resistor R2 to adjust the oscillation frequency f2 of the ring oscillator 22.

The output unit 23 includes an NAND gate 231 ant an NOT gate 232. An input terminal M1 of the NAND gate 231 receives the output signal $V_{A9}$. An input terminal M2 of the NAND gate 231 receives an enable signal $V_{24}$. The NOT gate 232 produces a clock signal CLK2, wherein the clock signal CLK2 may have the oscillation frequency f2 in an ideal state.

The common MOS device or the resistor R2 used in the reference circuit 21 mostly exhibits the property with a positive temperature coefficient in the semiconductor manufacturing process; i.e., the higher the temperature, the larger the resistance effect thereof, and the smaller on the contrary. Therefore, this property can cause the currents, flowing through various devices, to decrease when the temperature increases.

From the formula Q=CV=IT for the electric charge and the formula F=1/T for the frequency, a formula F=I/CV=1/RC is obtained, wherein the symbols C, V, T and R denote the capacitance, the voltage, the period and the resistance respectively. Please refer to FIG. 2(b), which is a schematic diagram showing both an oscillation frequency and a resistance for a temperature change in the internal oscillator in FIG. 2(a). As shown, the curve U21 denotes the resistance Q2 for the temperature change, and the curve Y21 denotes the oscillation frequency f2 for the temperature change. The oscillation frequency f2 decreases when the resistance Q2 increases; conversely, the oscillation frequency f2 increases when the resistance Q2 decreases.

In order that the reference current close in magnitude can be provided in different temperatures, which causes each stage of the oscillator to keep the charge and the discharge rates without change for the temperature change, to achieve the object that the oscillation frequency does not drift for the temperature change, a more effective temperature compensating circuit is demanded.

SUMMARY OF THE INVENTION

It is an object of the present invention to provide a temperature compensating circuit and method. A connection combination established between a negative-temperature-coefficient resistor and a positive-temperature-coefficient resistor is utilized to provide a reference current close in magnitude, which causes all stages of the oscillator to keep charging and discharging rates without change for the temperature change, so as to accomplish the effect of compensating the oscillation frequency in the temperature compensating circuit.

It is therefore the first aspect of the present invention to provide a temperature compensating circuit including a reference circuit, a first transistor and a second transistor. The reference circuit has a reference current and a resistance circuit, wherein the resistance circuit has a first terminal receiving the reference current, a second terminal and a negative-temperature-coefficient resistor, and at least a first portion of the reference current flows through the negative temperature coefficient resistor. The first transistor has a drain, a source, a gate and a path disposed between the drain and the source, wherein the path of the first transistor is connected in series with the resistance circuit, and the gate of the first transistor is electrically connected to the drain of the first transistor and the second terminal of the resistance circuit. The second transistor is electrically connected to the first transistor and has a drain, wherein the first and the second transistors constitute a current mirror, the drain of the second transistor produces a first current, and the temperature compensating circuit utilizes the negative-temperature-coefficient resistor to compensate the first current for a temperature change in the temperature compensating circuit.

It is therefore the second aspect of the present invention to provide a temperature compensating circuit including a reference circuit, a first transistor and a first circuit. The reference circuit has a reference current and a resistance circuit, wherein the resistance circuit includes a first terminal receiving the reference current, a second terminal and a negative-temperature-coefficient resistor. The first transistor has a drain, a source, a gate and a path disposed between the drain and the source, wherein the path of the first transistor is connected in series with the resistance circuit, the gate of the first transistor is electrically connected to the drain of the first transistor and the second terminal of the resistance circuit, and the drain of the first transistor produces a first bias-voltage signal. The first circuit produces a first output signal having a variable frequency in response to the first bias-voltage signal, wherein the temperature compensating circuit utilizes the negative-temperature-coefficient resistor to compensate the variable frequency of the first output signal for a temperature change in the temperature compensating circuit.

It is therefore the third aspect of the present invention to provide a temperature compensating method. The method includes the following steps. A reference current converted into a first bias-voltage signal by a resistance circuit and a first transistor, wherein the resistance circuit has a first terminal receiving the reference current, a second terminal and a negative-temperature-coefficient resistor, the first transistor has a drain, a source, a gate and a path disposed between the drain and the source, the path of the first transistor is connected in series with the resistance circuit, and the gate of the first transistor is electrically connected to the drain of the first transistor and the second terminal of the resistance circuit. A first output signal having a variable frequency is produced in response to the first bias-voltage signal. In addition, the negative-temperature-coefficient resistor is utilized to compensate the variable frequency of the first output signal for a temperature change.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
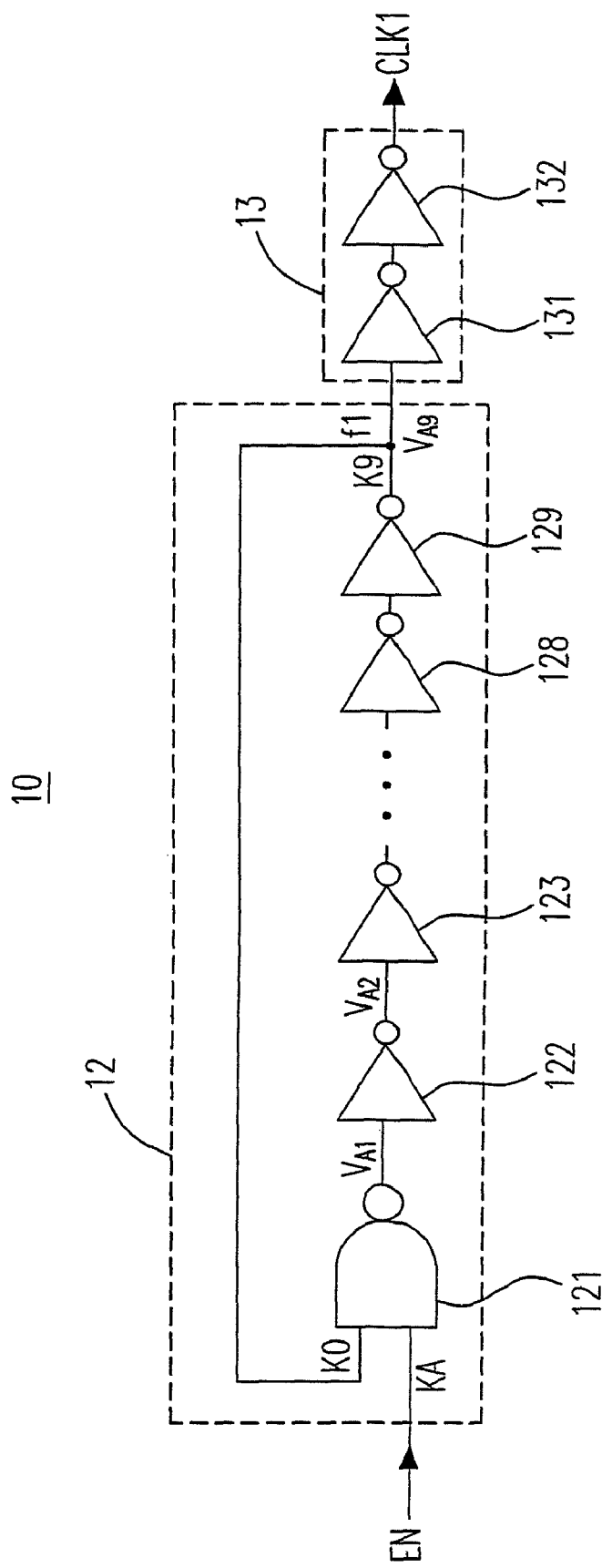
FIG. 1 is a schematic diagram showing a conventional internal oscillator.
Figure 2A:
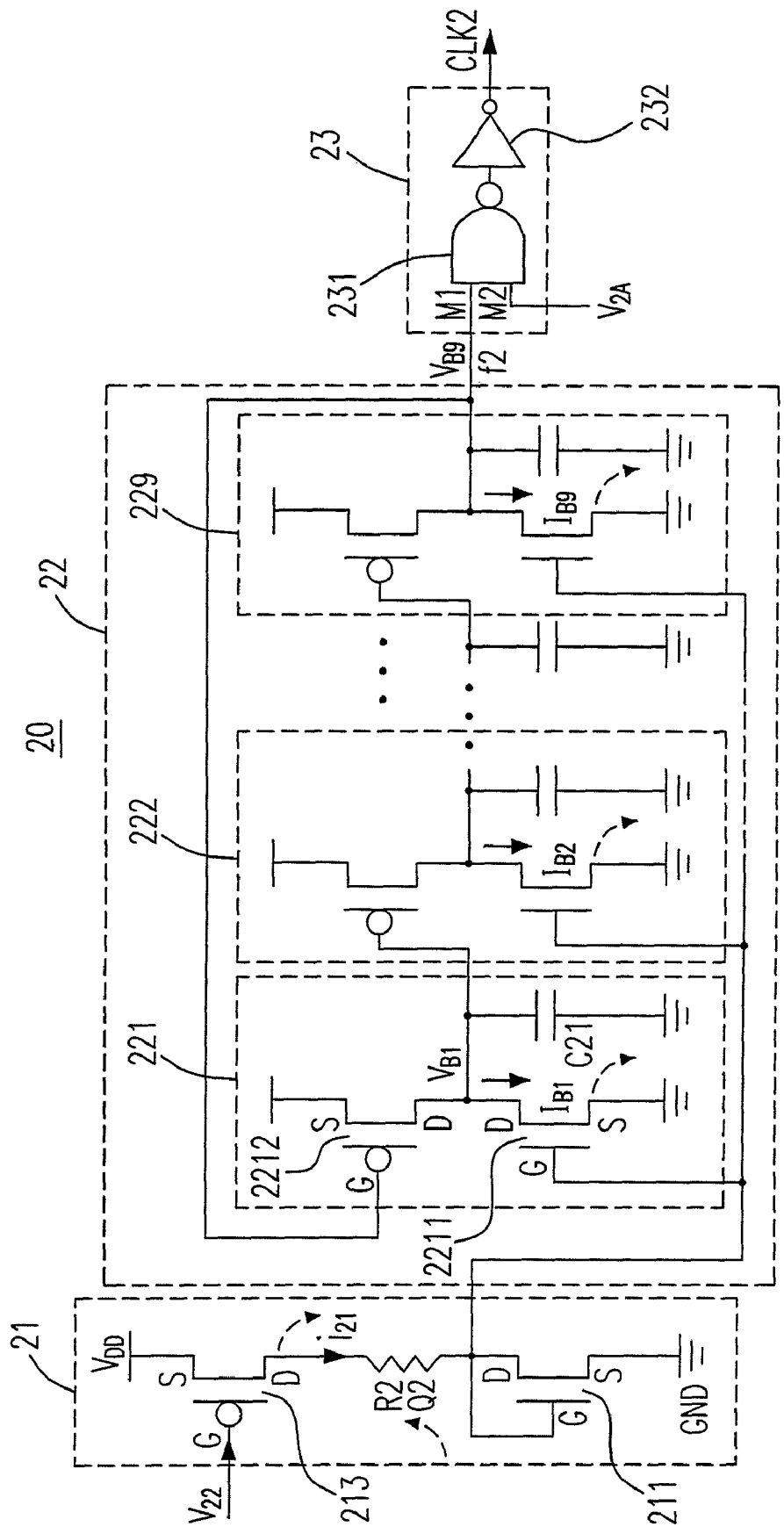
FIG. 2(a) is a schematic diagram showing another conventional internal oscillator.
Figure 2B:
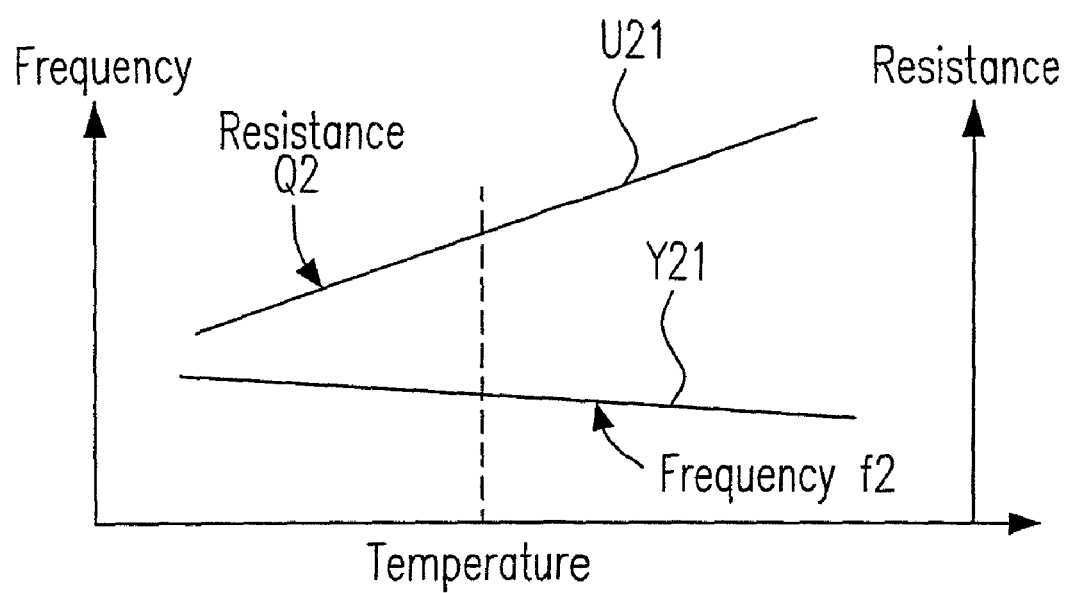
FIG. 2(b) is a schematic diagram showing both an oscillation frequency and a resistance for a temperature change in the internal oscillator in FIG. 2(a)
Figure 3:
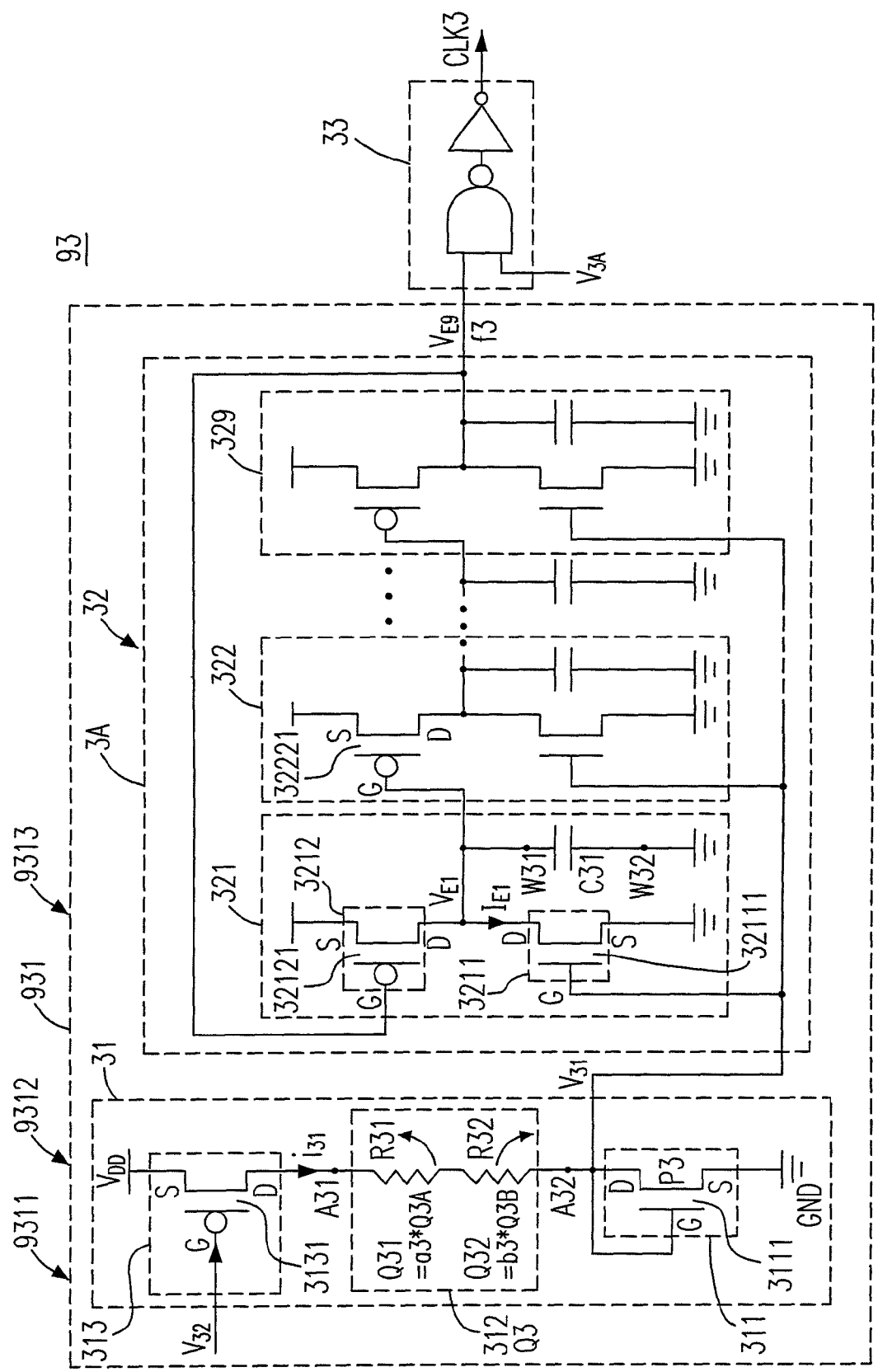
FIG. 3 is a schematic diagram showing a temperature compensating device according to the first embodiment of the present invention.

Please refer to FIG. 3, which is a schematic diagram showing a temperature compensating device 93 according to the first embodiment of the present invention. As shown, the temperature compensating device 93 includes a temperature compensating circuit 931 and an output unit 33.

The temperature compensating circuit 931 may be a temperature compensating configuration 9311 described as follows. The temperature compensating configuration 9311 includes a reference circuit 31 and a first circuit 3A, wherein the reference circuit 31 may be a reference current source circuit in an embodiment. The reference circuit 31 has a reference current $i_{31}$ and includes a transistor 311, a resistance circuit 312 and a transistor 313.

A first terminal A31 of the resistance circuit 312 receives the reference current $i_{31}$, and the resistance circuit 312 includes a positive-temperature-coefficient resistor R31 and a negative-temperature-coefficient resistor R32, wherein the positive-temperature-coefficient resistor R31, with a positive temperature coefficient, and the negative-temperature-coefficient resistor R32, with a negative temperature coefficient, form a series connection combination connected in series between a first terminal A31 and a second terminal A32 terminal of the resistance circuit 312.

The transistor 311 includes an NMOS transistor 3111. The source S of the NMOS transistor 3111 is electrically connected to a ground potential GND. The gate G of the NMOS transistor 3111 is electrically connected to the drain D of the NMOS transistor 3111 and the second terminal A32 of the resistance circuit 312. Besides, the drain D of the NMOS transistor 3111 produces a bias-voltage signal $V_{31}$.

The transistor 313 includes a PMOS transistor 3131. The source S of the PMOS transistor 3131 is electrically connected to a voltage source potential $V_{DD}$; the gate G of the PMOS transistor 3131 receives a control signal $V_{32}$; the drain D of the PMOS transistor 3131 is electrically connected to the first terminal A31 of the resistance circuit 312 and produces the reference current $i_{31}$. In a system of the bipolar junction transistor (BJT), the NMOS transistor 3111 may be a NPN transistor (not shown), and the PMOS transistor 3131 may be a PNP transistor (not shown), wherein the source S, the gate G and the drain D correspond to the emitter, the base and the collector of the BJT respectively, and the descriptions given below take the MOS-type transistors as examples.

The first circuit 3A receives the bias-voltage signal $V_{31}$, and produces an output signal $V_{E9}$ in response to the bias-voltage signal $V_{31}$, wherein the temperature compensating configuration 9311 utilizes the positive-temperature-coefficient resistor R31 and the negative-temperature-coefficient resistor R32 to compensate a variable frequency of the output signal $V_{E9}$ for a temperature change in the temperature compensating configuration 9311.

The first circuit 3A may include a transistor 3211 that includes an NMOS transistor 32111. The gate G of the NMOS transistor 32111 receives the bias-voltage signal $V_{31}$, and the drain D of the NMOS transistor 32111 produces a current $I_{E1}$, wherein the NMOS transistor 3111 and the NMOS transistor 32111 constitute a current mirror, and the current $I_{E1}$ is proportional to the reference current $i_{31}$ and is a factor of producing the variable frequency of the output signal $V_{E9}$.

The first circuit 3A may be a ring oscillator 32. The output signal $V_{E9}$ of the ring oscillator 32 has an oscillation frequency f3 being the variable frequency. The oscillation frequency f3 is compensated for the temperature change due to a compensation configuration including the positive-temperature-coefficient resistor R31 and the negative-temperature-coefficient resistor R32. The ring oscillator 32 includes odd-number stages of inverter circuits 321, 322, ... and 329, and each (such as 321) of the inverter circuits 321, 322, ... and 329 includes the same structure, wherein the inverter circuit 329 produces the output signal $V_{E9}$ fed back to the inverter circuit 321.

The inverter circuit 321 receives the output signal $V_{E9}$ and the bias-voltage signal $V_{31}$, and produces an output signal $V_{E1}$ in response to the output signal $V_{E9}$ and the bias-voltage signal $V_{31}$, wherein the output signal $V_{E1}$ has a delay and an inversion in comparison with the output signal $V_{E9}$. The inverter circuit 321 may includes a transistor 3211, a transistor 3212 and a capacitor C31. The transistor 3211 includes an NMOS transistor 32111. A first terminal W31 of the capacitor C31 is electrically connected to the drain D of the NMOS transistor 32111. A second terminal W32 of the capacitor C31 is electrically connected to the source S of the NMOS transistor 32111. A charging rate and a discharging rate of the capacitor C31 are kept for the temperature change.

The transistor 3212 includes a PMOS transistor 32121. The gate G of the PMOS transistor 32121 receives the output signal $V_{E9}$, and the drain D of the PMOS transistor 32121 is electrically connected to the drain D of the NMOS transistor 32111, and produces the output signal $V_{E1}$ provided to the gate G of a PMOS transistor 32221 of the inverter circuit 322. The output unit 33 receives the output signal $V_{E9}$ and an enable signal $V_{3A}$, and produces a clock signal CLK3, wherein the clock signal CLK3 may have the oscillation frequency f3 in an ideal state.

The temperature compensating circuit 931 may be a temperature compensating configuration 9312 described as follows. The temperature compensating configuration 9312 includes a reference circuit 31 and a first circuit 3A. The reference circuit 31, e.g. a reference current source circuit, has a reference current $i_{31}$, and includes a resistance circuit 312 and a transistor 311. The resistance circuit 312 includes a negative-temperature-coefficient resistor R32, wherein the first terminal A31 of the resistance circuit 312 receives the reference current $i_{31}$, and at least a first portion of the reference current $i_{31}$ flows through the negative temperature coefficient resistor R32.

A path P3 disposed between the drain D and the source S of the transistor 311 is connected in series with the resistance circuit 312, the gate G of the transistor 311 is electrically connected to the drain D of the transistor 311 and the second terminal A32 of the resistance circuit 312, and the drain D of the transistor 311 produces a bias-voltage signal $V_{31}$. The first circuit 3A produces an output signal $V_{E9}$ in response to the bias-voltage signal $V_{31}$, wherein the temperature compensating configuration 9312 utilizes the negative-temperature-coefficient resistor R32 to compensate the output signal $V_{E9}$ for a temperature change in the temperature compensating configuration 9312.

The temperature compensating circuit 931 may be a temperature compensating configuration 9313 described as follows. The temperature compensating configuration 9313 includes a reference circuit 31 and a transistor 3211. The reference circuit 31 has a reference current $i_{31}$, and includes a resistance circuit 312 and a transistor 311. The resistance circuit 312 includes at least a negative-temperature-coefficient resistor R32, wherein a first terminal A31 of the resistance circuit 312 receives the reference current $i_{31}$, and at least a portion of the reference current $i_{31}$ flows through the negative temperature coefficient resistor R32.

A path P3 disposed between the drain D and the source S of the transistor 311 is connected in series with the resistance circuit 312, the gate G of the transistor 311 is electrically connected to the drain D of the transistor 311 and the second terminal A32 of the resistance circuit 312. The transistor 3211 is electrically connected to the transistor 311; e.g., the gate G of the transistor 3211 is electrically connected to the gate G of the transistor 311. The transistor 311 and the transistor 3211 constitute a current mirror; the drain D of the transistor 3211 produces a current $I_{E1}$; the temperature compensating configuration 9313 utilizes the negative-temperature-coefficient resistor R32 to compensate the current $I_{E1}$ for a temperature change in the temperature compensating configuration 9313.

The transistor 3211 may be disposed in a ring oscillator 32 having an oscillation frequency f3, and the oscillation frequency f3 is compensated for the temperature change through a compensation of the current $I_{E1}$. The resistance circuit 312 may further includes at least a positive-temperature-coefficient resistor R31, wherein at least a portion of the reference current $i_{31}$ flows through the positive-temperature-coefficient resistor R31, and a preset connection combination between the at least a negative-temperature-coefficient resistor R32 and the at least a positive-temperature-coefficient resistor R31 is established, so that the temperature compensating configuration 9313 utilizes the resistance circuit 312 to compensate the current $I_{E1}$ for the temperature change.

Figure 4A:
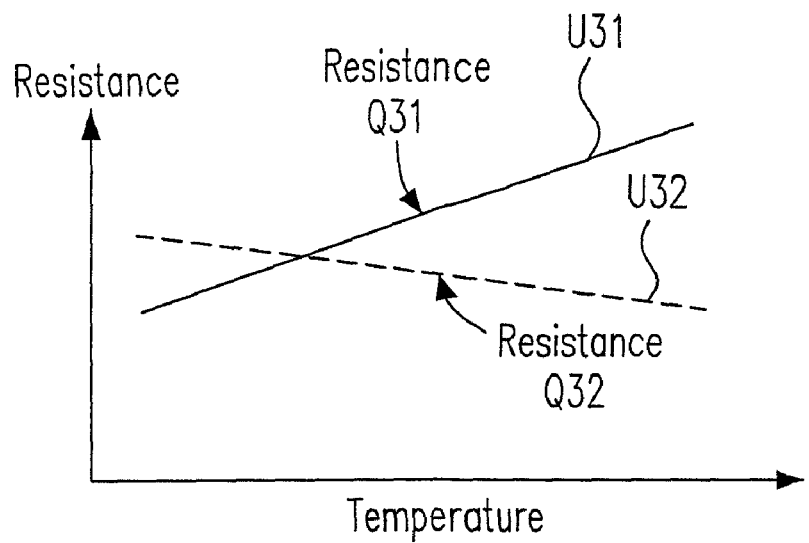
FIG. 4(a) is a schematic diagram showing resistances for a temperature change according to the first embodiment of the present invention.
Figure 4B:
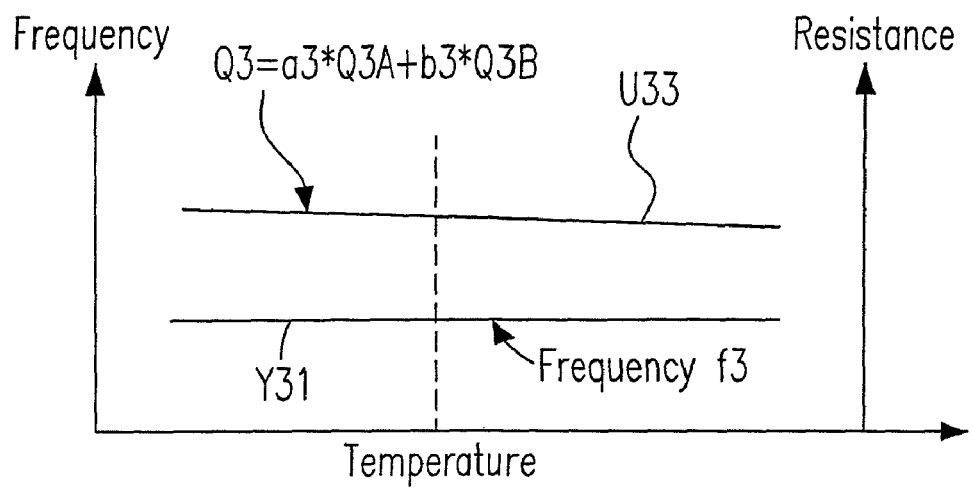
FIG. 4(b) is a schematic diagram showing both an oscillation frequency and a resistance for the temperature change according to the first embodiment of the present invention.

Please refer to FIG. 4(a) and FIG. 4(b); FIG. 4(a) is a schematic diagram showing the resistances Q31 and Q32 for a temperature change according to the first embodiment of the present invention; FIG. 4(b) is a schematic diagram showing both the oscillation frequency f3 and a resistance Q3 for the temperature change according to the first embodiment of the present invention. As shown, FIG. 4(a) and FIG. 4(b) are in a state of the temperature compensating configuration 9311; the curve U31 denotes the resistance Q31 (=a3*Q3A) of the positive-temperature-coefficient resistor R31 for the temperature change in the temperature compensating configuration 9311; the curve U32 denotes the resistance Q32 (=b3*Q3B) of the negative-temperature-coefficient resistor R32 for the temperature change; the curve U33 denotes the resistance Q3 (=a3*Q3A+b3*Q3B) of the resistance circuit 312 for the temperature change; the curve Y31 denotes the oscillation frequency f3 for the temperature change.

The resistance Q31, with a positive temperature coefficient, and the resistance Q32, with a negative temperature coefficient, adjust the resistance Q3 of the resistance circuit 312, which causes the reference circuit 31 to provide the reference current $i_{31}$ close in magnitude under different temperatures in the temperature compensating configuration 9311. Therefore, all stages of the inverter circuits 321, 322, . . . and 329 in the ring oscillator 32 keep charging and discharging rates without change for the temperature change, which causes the oscillation frequency f3 to not drift for the temperature change.

When the temperature increases, the resistance Q31 of the positive-temperature-coefficient resistor R31 can increases, but the resistance Q31 of the negative-temperature-coefficient resistor R32 can decrease. The characteristic-coefficient ratio (a3:b3) between the resistance Q31 and the resistance Q32 is adjusted according to the temperature property (in general, positive correlation to the temperature; i.e. the frequency decreases when the temperature increases) of the original circuit configuration (lack of the resistance Q32) in order to adjust the reference current $i_{31}$, flowing through the resistance Q31 and the resistance Q32, and compensate the frequency drift produced in the ring oscillator 32 due to the temperature change. Therefore, the temperature compensating configuration 9311 can be applied to serve as the internal oscillator, the frequency of which does not drift for the temperature change.

Figure 5:
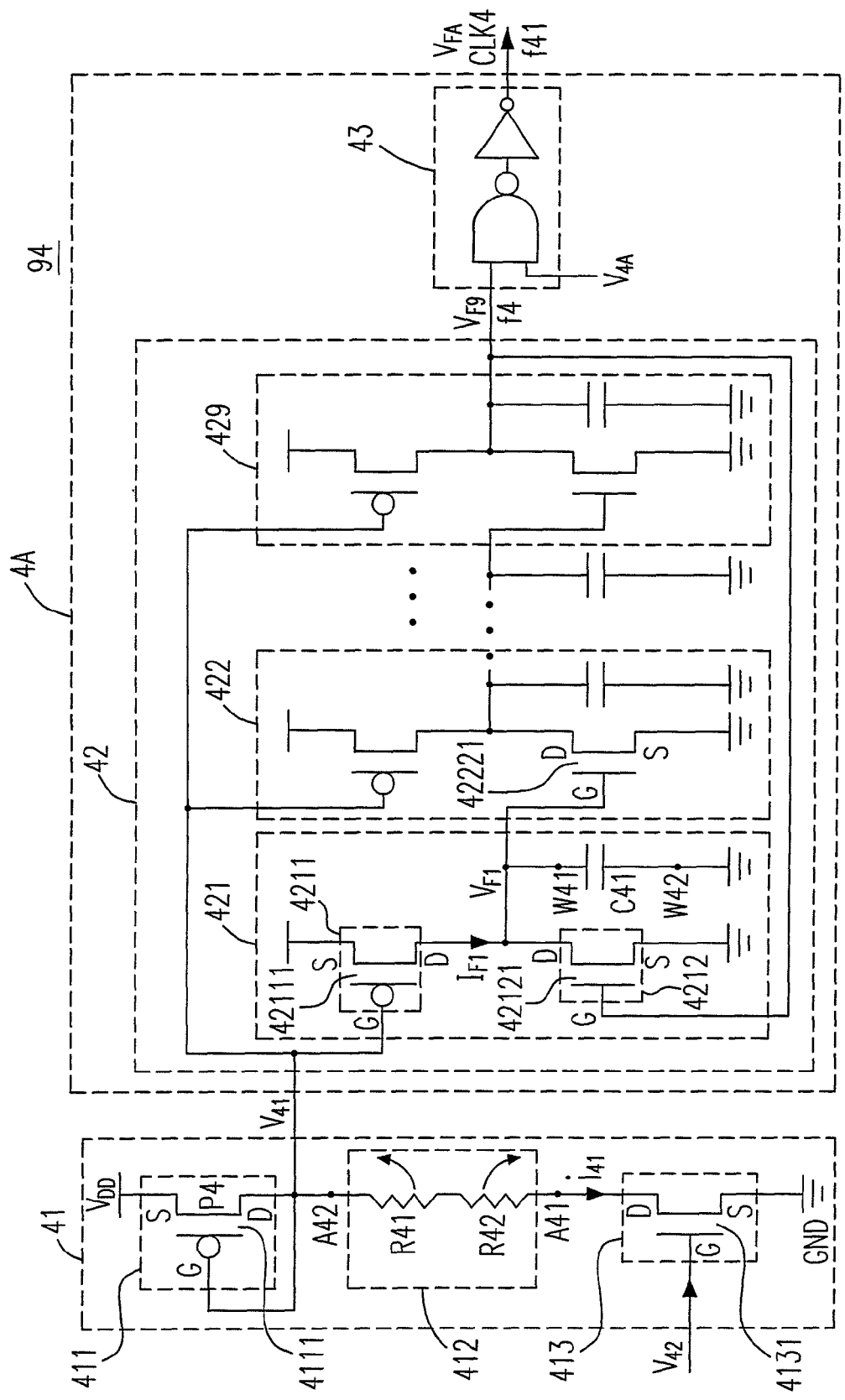
FIG. 5 is a schematic diagram showing a temperature compensating device according to the second embodiment of the present invention.

Please refer to FIG. 5, which is a schematic diagram showing a temperature compensating device 94 according to the second embodiment of the present invention. As shown, the temperature compensating device 94 includes a reference circuit 41 and a first circuit 4A, wherein the reference circuit 31 may be a reference current source circuit in an embodiment. The reference circuit 41 has a reference current $i_{41}$ and includes a transistor 411, a resistance circuit 412 and a transistor 413.

A first terminal A41 of the resistance circuit 412 receives the reference current $i_{41}$, and the resistance circuit 412 includes a positive-temperature-coefficient resistor R41 and a negative-temperature-coefficient resistor R42, wherein the positive-temperature-coefficient resistor R41 and the negative-temperature-coefficient resistor R42 form a series connection combination connected in series between a first terminal A41 and a second terminal A42 of the resistance circuit 412. In an embodiment, the positive-temperature-coefficient resistor R41 and the negative-temperature-coefficient resistor R42 form a parallel connection combination between the first terminal A41 and the second terminal A42 of the resistance circuit 412. In an embodiment, the resistance circuit 412 includes at least a positive-temperature-coefficient resistor R41 and at least a negative-temperature-coefficient resistor R42, wherein the at least a positive-temperature-coefficient resistor R41 and the at least a negative-temperature-coefficient resistor R42 are connected in series or parallel according to a preset connection combination.

The transistor 411 includes a PMOS transistor 4111. The source S of the PMOS transistor 4111 is electrically connected to a voltage source potential $V_{DD}$. The gate G of the PMOS transistor 4111 is electrically connected to the drain D of the PMOS transistor 4111 and the second terminal A42 of the resistance circuit 412. Besides, the drain D of the PMOS transistor 4111 produces a bias-voltage signal $V_{41}$.

The transistor 413 includes an NMOS transistor 4131. The source S of the NMOS transistor 4131 is electrically connected to a ground potential GND. The gate G of the NMOS transistor 4131 receives a control signal $V_{42}$; the drain D of the NMOS transistor 4131 is electrically connected to the first terminal A41 of the resistance circuit 412 and produces the reference current $i_{41}$.

The first circuit 4A produces an output signal $V_{F4}$ in response to the bias-voltage signal $V_{41}$, wherein the temperature compensating device 94 utilizes the resistance circuit 412 to compensate a variable frequency of the output signal $V_{F4}$ for a temperature change in the temperature compensating device 94. The first circuit 4A may include a ring oscillator 42 and an output unit 43. The ring oscillator 42 receives the bias-voltage signal $V_{41}$, and produces an output signal $V_{F9}$ having an oscillation frequency f4 in response to the bias-voltage signal $V_{41}$. The output unit 43 receives the output signal $V_{F9}$ and an enable signal $V_{44}$, and produces the output signal $V_{F4}$, wherein the output signal $V_{F4}$ is a clock signal CLK4 having an output frequency f41. The temperature compensating device 94 utilizes the resistance circuit 412 to compensate the output frequency f41 being the variable frequency for a temperature change in the temperature compensating device 94.

The ring oscillator 42 includes odd-number stages of inverter circuits 421, 422, . . . and 429, and each (such as 421) of the inverter circuits 421, 422, . . . and 429 includes the same structure, wherein the inverter circuit 429 produces the output signal $V_{F9}$ fed back to the inverter circuit 421. The inverter circuit 421 may includes a transistor 4211, a transistor 4212 and a capacitor C41.

The transistor 4211 includes a PMOS transistor 42111. The gate of the PMOS transistor 42111 receives the bias-voltage signal $V_{41}$, and the drain D of the PMOS transistor 42111 produces a current $I_{F1}$, wherein the PMOS transistor 4111 and the PMOS transistor 42111 constitute a current mirror, and the current $I_{F1}$ is proportional to the reference current $i_{41}$.

The transistor 4212 includes an NMOS transistor 42121. The gate G of the NMOS transistor 42121 receives the output signal $V_{F9}$, and the drain D of the NMOS transistor 42121 is electrically connected to the drain D of the PMOS transistor 42111. A first terminal W41 of the capacitor C41 is electrically connected to the drain D of the NMOS transistor 42121. A second terminal W42 of the capacitor C41 is electrically connected to the source S of the NMOS transistor 42121. The drain D of the NMOS transistor 42121 produces the output signal $V_{F1}$ provided to the gate G of an NMOS transistor 42221 of the inverter circuit 422.

Figure 6:
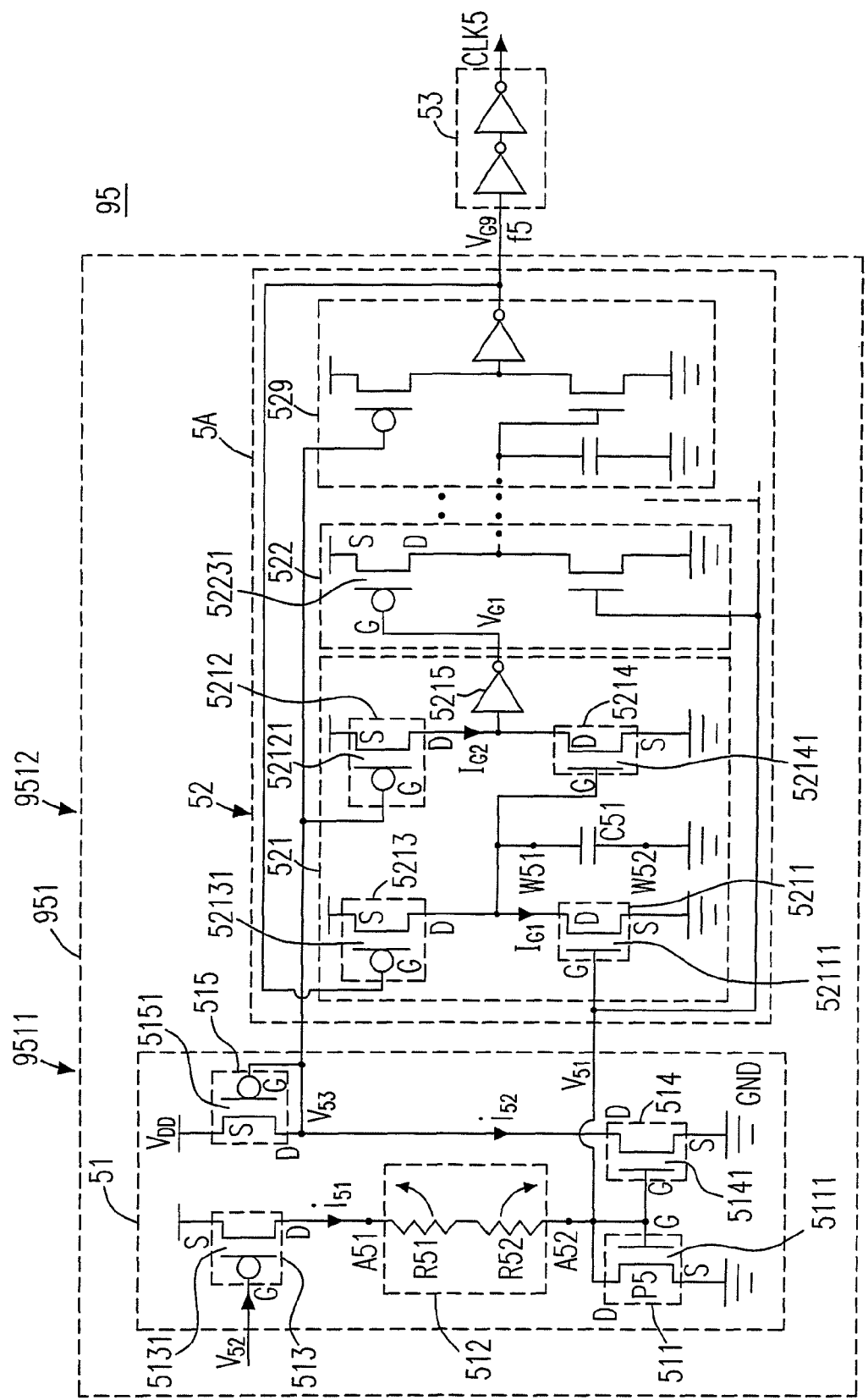
FIG. 6 is a schematic diagram showing a temperature compensating device according to the third embodiment of the present invention.

Please refer to FIG. 6, which is a schematic diagram showing a temperature compensating device 95 according to the third embodiment of the present invention. As shown, the temperature compensating device 95 includes a temperature compensating circuit 951 and an output unit 53.

The temperature compensating circuit 951 may be a temperature compensating configuration 9511 described as follows. The temperature compensating configuration 9511 includes a reference circuit 51 and a first circuit 5A. The reference circuit 51 has a reference current $i_{51}$ and includes plural transistors 511, 513, 514, and 515 and a resistance circuit 512.

A first terminal A51 of the resistance circuit 512 receives the reference current $i_{51}$, and the resistance circuit 512 includes a positive-temperature-coefficient resistor R51 and a negative-temperature-coefficient resistor R52, wherein the positive-temperature-coefficient resistor R51 and the negative-temperature-coefficient resistor R52 form a series connection combination connected in series between the first terminal A51 and a second terminal A32 of the resistance circuit 512.

The transistor 511 includes an NMOS transistor 5111. The source S of the NMOS transistor 5111 is electrically connected to a ground potential GND. The gate G of the NMOS transistor 5111 is electrically connected to the drain D of the NMOS transistor 5111 and the second terminal A52 of the resistance circuit 512. Besides, the drain D of the NMOS transistor 5111 produces a bias-voltage signal $V_{51}$.

The transistor 513 includes a PMOS transistor 5131. The source S of the PMOS transistor 5131 is electrically connected to a voltage source potential $V_{DD}$; the gate G of the PMOS transistor 5131 receives a control signal $V_{52}$; the drain D of the PMOS transistor 5131 is electrically connected to the first terminal A51 of the resistance circuit 512 and produces the reference current $i_{51}$.

The transistor 514 includes an NMOS transistor 5141. The gate G of the NMOS transistor 5141 receives the bias-voltage signal $V_{51}$, and the drain D of the NMOS transistor 5141 produces a current $i_{52}$, wherein the NMOS transistor 5111 and the NMOS transistor 5141 constitute a current mirror, and the current $i_{52}$ is proportional to the reference current $i_{51}$. The transistor 515 includes a PMOS transistor 5151. The drain D of the PMOS transistor 5151 is electrically connected to the gate G of the PMOS transistor 5151 and the drain D of the NMOS transistor 5141. Besides, the drain D of the PMOS transistor 5151 produces a bias-voltage signal $V_{53}$.

The first circuit 5A receives the bias-voltage signal $V_{51}$ and the bias-voltage signal $V_{53}$, and produces an output signal $V_{G9}$ in response to the bias-voltage signal $V_{51}$ and the bias-voltage signal $V_{51}$, wherein the temperature compensating configuration 9511 utilizes the positive-temperature-coefficient resistor R51 and the negative-temperature-coefficient resistor R52 to compensate a variable frequency of the output signal $V_{G9}$ for a temperature change in the temperature compensating configuration 9511.

The first circuit 5A may include a transistor 5211 and a transistor 5212. The transistor 5211 includes an NMOS transistor 52111. The gate G of the NMOS transistor 52111 receives the bias-voltage signal $V_{51}$, and the drain D of the NMOS transistor 52111 produces a current $I_{G1}$, wherein the NMOS transistor 5111 and the NMOS transistor 52111 constitute a current mirror, and the current $I_{G1}$ is proportional to the reference current $i_{51}$ and is a first factor of producing the variable frequency of the output signal $V_{G9}$. The transistor 5212 includes a PMOS transistor 52121. The gate G of the PMOS transistor 52121 receives the bias-voltage signal $V_{53}$, and the drain D of the PMOS transistor 52121 produces a current $I_{G2}$, wherein the PMOS transistor 5151 and the PMOS transistor 52121 constitute a current mirror, and the current $I_{G2}$ is proportional to the current $i_{52}$ and is a second factor of producing the variable frequency of the output signal $V_{G9}$.

The first circuit 5A may be a ring oscillator 52. The output signal $V_{G9}$ of the ring oscillator 52 has an oscillation frequency f5 being the variable frequency. The oscillation frequency f5 is compensated for the temperature change due to a compensation configuration including the positive-temperature-coefficient resistor R51 and the negative-temperature-coefficient resistor R52. The ring oscillator 52 includes odd-number stages of inverter circuits 521, 522, . . . and 529, and each (such as 521) of the inverter circuits 521, 522, . . . and 529 includes the same structure, wherein the inverter circuit 529 produces the output signal $V_{G9}$ fed back to the inverter circuit 521.

The inverter circuit 521 receives the output signal $V_{G9}$, the bias-voltage signal $V_{51}$ and the bias-voltage signal $V_{53}$, and produces an output signal $V_{G1}$ in response to the output signal $V_{G9}$, the bias-voltage signal $V_{51}$ and the bias-voltage signal $V_{53}$, wherein the output signal $V_{G1}$ has a delay and an inversion in comparison with the output signal $V_{G9}$. The inverter circuit 521 may includes plural transistors 5211, 5212, 5213 and 5214, a capacitor C51 and an NOT gate 5215. A first terminal W51 of the capacitor C51 is electrically connected to the drain D of the NMOS transistor 52111. A second terminal W52 of the capacitor C51 is electrically connected to the source S of the NMOS transistor 52111. A charging rate and a discharging rate of the capacitor C51 are kept for the temperature change.

The transistor 5213 includes a PMOS transistor 52131. The gate G of the PMOS transistor 52131 receives the output signal $V_{G9}$, and the drain D of the PMOS transistor 52131 is electrically connected to the drain D of the NMOS transistor 52111. The transistor 5214 includes an NMOS transistor 52141. The gate G of the NMOS transistor 52141 is electrically connected to the drain D of the NMOS transistor 52111, the source S of the NMOS transistor 52141 is electrically connected to the source S of the NMOS transistor 52111, and the drain D of the NMOS transistor 52141 is electrically connected to the drain D of the PMOS transistor 52121.

The input terminal of the NOT gate 5215 is electrically connected to the drain D of the PMOS transistor 52121, and the output terminal of the NOT gate 5215 produces the output signal $V_{G1}$ provided to the gate G of a PMOS transistor 52231 of the inverter circuit 522. The output unit 53 receives the output signal $V_{G9}$ and produces a clock signal CLK5, wherein the clock signal CLK5 may have the oscillation frequency f3 in an ideal state.

The temperature compensating circuit 951 may be a temperature compensating configuration 9512 described as follows. The temperature compensating configuration 9512 includes a reference circuit 51 and a first circuit 5A. The reference circuit 51 has a reference current $i_{51}$ and includes a resistance circuit 512 and plural transistor 511, 514 and 515. The resistance circuit 512 includes a negative-temperature-coefficient resistor R52, wherein a first terminal A51 of the resistance circuit 512 receives the reference current $i_{51}$ and at least a first portion of the reference current $i_{51}$ flows through the negative temperature coefficient resistor R52.

A path P5 disposed between the drain D and the source S of the transistor 511 is connected in series with the resistance circuit 512, the gate G of the transistor 511 is electrically connected to the drain D of the transistor 511 and a second terminal A52 of the resistance circuit 512, and the drain D of the transistor 511 produces a bias-voltage signal $V_{51}$. The gate G of the transistor 514 receives the bias-voltage signal $V_{51}$, and the drain D of the transistor 514 produces a current $i_{52}$, wherein the transistor 511 and the transistor 514 constitute a current mirror, and the current $i_{52}$ is proportional to the reference current $i_{51}$.

The drain D of the transistor 515 is electrically connected to the gate G of the transistor 515, and the drain D of the transistor 515 produces a bias-voltage signal $V_{53}$. The first circuit 5A produces an output signal $V_{G9}$ in response to the bias-voltage signal $V_{51}$ and the bias-voltage signal $V_{53}$, wherein the temperature compensating configuration 9512 utilizes the negative-temperature-coefficient resistor R52 to compensate the output signal $V_{G9}$ for a temperature change in the temperature compensating configuration 9512.

Figure 7:
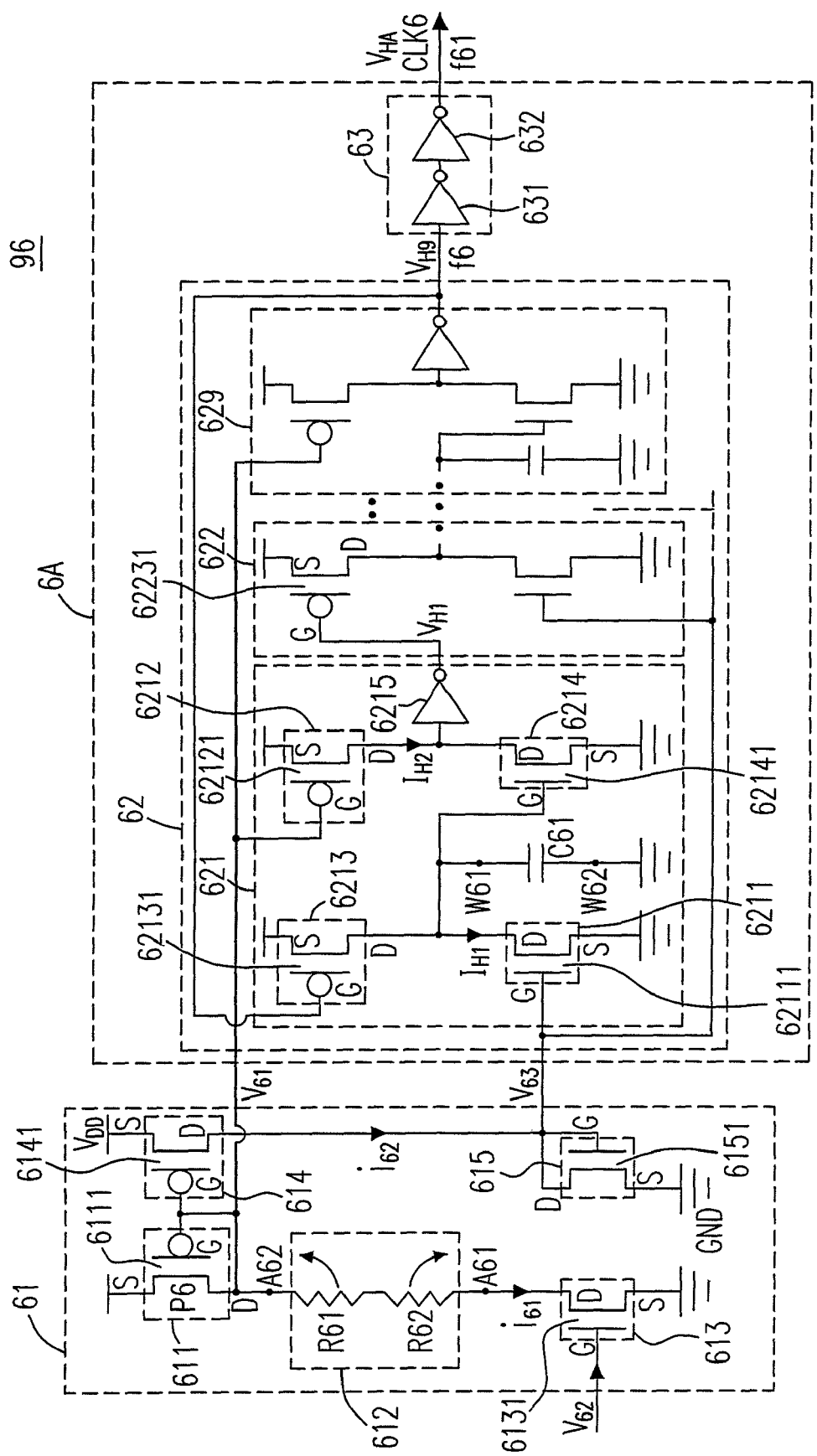
FIG. 7 is a schematic diagram showing a temperature compensating device according to the fourth embodiment of the present invention.

Please refer to FIG. 7, which is a schematic diagram showing a temperature compensating device 96 according to the fourth embodiment of the present invention. As shown, the temperature compensating device 96 includes a reference circuit 51 and a first circuit 6A. The reference circuit 61 has a reference current $i_{61}$ and includes plural transistors 611, 613, 614, and 615 and a resistance circuit 612.

A first terminal A61 of the resistance circuit 612 receives the reference current $i_{61}$, and the resistance circuit 612 includes a positive-temperature-coefficient resistor R61 and a negative-temperature-coefficient resistor R62, wherein the positive-temperature-coefficient resistor R61 and the negative-temperature-coefficient resistor R62 form a series connection combination connected in series between the first terminal A61 and a second terminal A62 of the resistance circuit 612.

The transistor 611 includes a PMOS transistor 6111. The source S of the PMOS transistor 6111 is electrically connected to a voltage source potential $V_{DD}$. The gate G of the PMOS transistor 6111 is electrically connected to the drain D of the PMOS transistor 6111 and the second terminal A62 of the resistance circuit 612. Besides, the drain D of the PMOS transistor 6111 produces a bias-voltage signal $V_{61}$.

The transistor 613 includes an NMOS transistor 6131. The source S of the NMOS transistor 6131 is electrically connected to a ground potential GND; the gate G of the NMOS transistor 6131 receives a control signal $V_{62}$; the drain D of the NMOS transistor 6131 is electrically connected to the first terminal A61 of the resistance circuit 612 and produces the reference current $i_{61}$.

The transistor 614 includes a PMOS transistor 6141. The gate G of the PMOS transistor 6141 receives the bias-voltage signal $V_{61}$, and the drain D of the PMOS transistor 6141 produces a current $i_{62}$, wherein the PMOS transistor 6111 and the PMOS transistor 6141 constitute a current mirror, and the current $i_{62}$ is proportional to the reference current $i_{61}$. The transistor 615 includes an NMOS transistor 6151. The drain D of the NMOS transistor 6151 is electrically connected to the gate G of the NMOS transistor 6151 and the drain D of the PMOS transistor 6141. Besides, the drain D of the NMOS transistor 6151 produces a bias-voltage signal $V_{63}$.

The first circuit 6A receives the bias-voltage signal $V_{61}$ and the bias-voltage signal $V_{63}$, and produces an output signal $V_{HA}$ in response to the bias-voltage signal $V_{61}$ and the bias-voltage signal $V_{63}$, wherein the temperature compensating device 96 utilizes the resistance circuit 612 to compensate a variable frequency of the output signal $V_{HA}$ for a temperature change in the temperature compensating device 96.

The first circuit 6A may include a ring oscillator 62 and an output unit 63. The ring oscillator 62 receives the bias-voltage signal $V_{61}$ and the bias-voltage signal $V_{63}$, and produces an output signal $V_{H9}$ having an oscillation frequency f6 in response to the bias-voltage signal $V_{61}$ and the bias-voltage signal $V_{63}$.

The ring oscillator 62 includes odd-number stages of inverter circuits 621, 622, ... and 629, and each (such as 621) of the inverter circuits 621, 622, ... and 629 includes the same structure, wherein the inverter circuit 629 produces the output signal $V_{H9}$ fed back to the inverter circuit 621. The inverter circuit 621 may includes plural transistors 6211, 6212, 6213 and 6214, a capacitor C61 and an NOT gate 6215.

The transistor 6211 includes an NMOS transistor 62111. The gate of the NMOS transistor 62111 receives the bias-voltage signal $V_{63}$, and the drain D of the NMOS transistor 62111 produces a current $I_{H1}$, wherein the NMOS transistor 6151 and the NMOS transistor 62111 constitute a current mirror, and the current $I_{H1}$ is proportional to the current $i_{62}$ and is a first factor of producing the variable frequency of the output signal $V_{HA}$. The transistor 6212 includes a PMOS transistor 62121. The gate G of the PMOS transistor 62121 receives the bias-voltage signal $V_{61}$, and the drain D of the PMOS transistor 62121 produces a current $I_{H2}$, wherein the PMOS transistor 6111 and the PMOS transistor 62121 constitute a current mirror, and the current $I_{H2}$ is proportional to the reference current $i_{61}$ and is a second factor of producing the variable frequency of the output signal $V_{HA}$.

A first terminal W61 of the capacitor C61 is electrically connected to the drain D of the NMOS transistor 62111. A second terminal W62 of the capacitor C61 is electrically connected to the source S of the NMOS transistor 62111. The transistor 6213 includes a PMOS transistor 62131. The gate G of the PMOS transistor 62131 receives the output signal $V_{H9}$, and the drain D of the PMOS transistor 62131 is electrically connected to the drain D of the NMOS transistor 62111.

The transistor 6214 includes an NMOS transistor 62141. The gate G of the NMOS transistor 62141 is electrically connected to the drain D of the NMOS transistor 62111, the source S of the NMOS transistor 52141 is electrically connected to the source S of the NMOS transistor 62111, and the drain D of the NMOS transistor 62141 is electrically connected to the drain D of the PMOS transistor 62121. The input terminal of the NOT gate 6215 is electrically connected to the drain D of the PMOS transistor 62121, and the output terminal of the NOT gate 6215 produces the output signal $V_{H1}$ provided to the gate G of a PMOS transistor 62231 of the inverter circuit 622.

The output unit 63 receives the output signal $V_{H9}$ and produces the output signal $V_{HA}$, wherein the output signal $V_{HA}$ is a clock signal CLK6 having an output frequency f61. The temperature compensating device 96 utilizes the resistance circuit 612 to compensate the output frequency f61 being the variable frequency for the temperature change. Besides, the output unit 63 includes an NOT gate 631 and an NOT gate 632 connected in series with the NOT gate 631.

Please refer to FIG. 3, which is used to describe a temperature compensating method provided in the present invention. The temperature compensating method includes the following steps. A reference current $i_{31}$ is converted into a first bias-voltage signal $V_{31}$ by a resistance circuit 312 and a transistor 311, wherein the resistance circuit 312 has a first terminal A31 receiving the reference current $i_{31}$, a second terminal A32 and a negative-temperature-coefficient resistor R32, the transistor 311 has a drain D, a source S, a gate G and a path P3 disposed between the drain D and the source S of the transistor 311, the path P3 of the transistor 311 is connected in series with the resistance circuit 312, and the gate G of the transistor 311 is electrically connected to the drain D of the transistor 311 and the second terminal A32 of the resistance circuit 312. An output signal $V_{E9}$ having a variable frequency is produced in response to the bias-voltage signal $V_{E9}$. In addition, the negative-temperature-coefficient resistor R32 is utilized to compensate the variable frequency of the output signal $V_{E9}$ for a temperature change.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A temperature compensating circuit, comprising:
a reference circuit having a reference current and a resistance circuit, wherein the resistance circuit has a first terminal receiving the reference current, a second terminal and a negative-temperature-coefficient resistor, and at least a first portion of the reference current flows through the negative temperature coefficient resistor;
a first transistor having a drain, a source, a gate and a path disposed between the drain and the source, wherein the path of the first transistor is connected in series with the resistance circuit, the gate of the first transistor is electrically connected to the drain of the first transistor and the second terminal of the resistance circuit, and the drain of the first transistor produces a first bias-voltage signal;

a second transistor electrically connected to the first transistor and having a drain; and a ring oscillator producing a first output signal having an oscillation frequency in response to the first bias-voltage signal, and including an inverter circuit producing a second output signal in response to the first output signal and the first bias-voltage signal, wherein:

the first and the second transistors constitute a current mirror;

the drain of the second transistor produces a first current; and the temperature compensating circuit utilizes the negative-temperature-coefficient resistor to compensate the first current for a temperature change in the temperature compensating circuit.

2. A temperature compensating circuit according to claim 1, wherein:

the first current is proportional to the reference current;

the second transistor is disposed in the ring oscillator;

the oscillation frequency is compensated for the temperature change through a compensation of the first current;

the resistance circuit further comprises a positive-temperature-coefficient resistor;

at least a second portion of the reference current flows through the positive-temperature-coefficient resistor; and a preset connection combination between the negative-temperature-coefficient and the positive-temperature-coefficient resistors is established, so that the temperature compensating circuit further utilizes the positive-temperature-coefficient resistor to compensate the first current for the temperature change.

3. A temperature compensating circuit, comprising:

a reference circuit having a reference current and a resistance circuit, wherein the resistance circuit includes a first terminal receiving the reference current, a second terminal and a negative-temperature-coefficient resistor;

a first transistor having a drain, a source, a gate and a path disposed between the drain and the source, wherein the path of the first transistor is connected in series with the resistance circuit, the gate of the first transistor is electrically connected to the drain of the first transistor and the second terminal of the resistance circuit, and the drain of the first transistor produces a first bias-voltage signal; and a first circuit producing a first output signal having a variable frequency in response to the first bias-voltage signal, wherein:

the temperature compensating circuit utilizes the negative-temperature-coefficient resistor to compensate the variable frequency of the first output signal for a temperature change in the temperature compensating circuit;

the first circuit comprises a ring oscillator producing a second output signal having an oscillation frequency in response to the first bias-voltage signal, and the ring oscillator includes an inverter circuit producing a third output signal in response to the second output signal and the first bias-voltage signal.

4. A temperature compensating circuit according to claim 3, wherein the first circuit comprises:

a second transistor having a gate receiving the first bias-voltage signal, a source and a drain producing a first current, wherein the first and the second transistors constitute a current mirror, and the first current is proportional to the reference current and is a factor of producing the variable frequency of the first output signal.

5. A temperature compensating circuit according to claim 4, wherein:

the variable frequency is the oscillation frequency of the ring oscillator;

the third output signal has a delay and an inversion in comparison with the second output signal, the ring oscillator utilizes the third output signal to produce the second output signal, and the second transistor is disposed in the inverter circuit; and the inverter circuit further comprises:

a capacitor having a first terminal electrically connected to the drain of the second transistor and a second terminal electrically connected to the source of the second transistor, wherein a charging and a discharging rates of the capacitor are kept for the temperature change; and a third transistor having a gate receiving the second output signal and a drain electrically connected to the drain of the second transistor, wherein the drain of the third transistor produces the second output signal.

6. A temperature compensating circuit according to claim 5, wherein the first, the second and the third transistors are in a specific state, and the specific state is one selected from a group consisting of:

a first state that the first and the second transistors are two NMOS transistors, and the third transistor is a PMOS transistor;

a second state that the first and the second transistors are two NPN transistors, and the third transistor is a PNP transistor;

a third state that the first and the second transistors are two PMOS transistors, and the third transistor is an NMOS transistor; and a fourth state that the first and the second transistors are two PNP transistors, and the third transistor is an NPN transistor.

7. A temperature compensating circuit according to claim 4, wherein the first circuit further comprises:

an output unit producing the first output signal in response to the second output signal, wherein:

the second transistor is disposed in the inverter circuit;

the first output signal is a clock signal;

the third output signal has a delay and an inversion in comparison with the second output signal; and the ring oscillator utilizes the third output signal to produce the second output signal.

8. A temperature compensating circuit according to claim 3, wherein the reference circuit further comprises:

a second transistor having a gate receiving a control signal and a drain electrically connected to the first terminal of the resistance circuit for producing the reference current;

a third transistor having a gate receiving the first bias-voltage signal and a drain producing a first current, wherein the first and the third transistors constitute a first current mirror, and the first current is proportional to the reference current; and a fourth transistor having a gate and a drain electrically connected to the gate of the fourth transistor and the drain of the third transistor, wherein the drain of the fourth transistor produces a second bias-voltage signal.

9. A temperature compensating circuit according to claim 8, wherein the first circuit comprises:
- a fifth transistor having a gate receiving the first bias-voltage signal, a source and a drain producing a second current, wherein the first and the fifth transistors constitute a second current mirror, and the second current is proportional to the reference current and is a first factor of producing the variable frequency of the first output signal; and
- a sixth transistor having a gate receiving the second bias-voltage signal, a source and a drain producing a third current, wherein the fourth and the sixth transistors constitute a third current mirror, and the third current is proportional to the first current and is a second factor of producing the variable frequency of the first output signal.

10. A temperature compensating circuit according to claim 9, wherein:
- the variable frequency is the oscillation frequency of the ring oscillator;
- the third output signal is in response to the second output signal, the first bias-voltage signal and the second bias-voltage signal, wherein the third output signal has a delay and an inversion in comparison with the second output signal, and the fifth and the sixth transistors are disposed in the inverter circuit; and
- the ring oscillator utilizes the third output signal to produce the second output signal.

11. A temperature compensating circuit according to claim 10, wherein the inverter circuit further comprises:
- a capacitor having a first terminal electrically connected to the drain of the fifth transistor and a second terminal electrically connected to the source of the fifth transistor, wherein a charging and a discharging rates of the capacitor are kept for the temperature change;
- a seventh transistor having a gate receiving the second output signal and a drain electrically connected to the drain of the fifth transistor;
- an eighth transistor having a gate electrically connected to the drain of the fifth transistor and a drain electrically connected to the drain of the sixth transistor; and
- an NOT gate having an input terminal electrically connected to the drain of the sixth transistor and an output terminal producing the third output signal, wherein the first, the second, the third, the fourth, the fifth, the sixth, the seventh and the eighth transistors are in a specific state, and the specific state is one selected from a group consisting of:
- a first state that the first, the third, the fifth and the eighth transistors are four NMOS transistors, and the second, the fourth, the sixth and the seventh transistors are four PMOS transistors; and
- a second state that the first, the third, the fifth and the eighth transistors are four NPN transistors, and the second, the fourth, the sixth and the seventh transistors are four PNP transistors.

12. A temperature compensating circuit according to claim 10, wherein the inverter circuit further comprises:
- a capacitor having a first terminal electrically connected to the drain of the sixth transistor and a second terminal electrically connected to the source of the sixth transistor, wherein a charging and a discharging rates of the capacitor are kept for the temperature change;
- a seventh transistor having a gate receiving the second output signal and a drain electrically connected to the drain of the sixth transistor;
- an eighth transistor having a gate electrically connected to the drain of the sixth transistor and a drain electrically connected to the drain of the fifth transistor; and
- an NOT gate having an input terminal electrically connected to the drain of the fifth transistor and an output terminal producing the third output signal, wherein the first, the second, the third, the fourth, the fifth, the sixth, the seventh and the eighth transistors are in a specific state, and the specific state is one selected from a group consisting of:
- a first state that the first, the third, the fifth and the seventh transistors are four PMOS transistors, and the second, the fourth, the sixth and the eighth transistors are four NMOS transistors; and
- a second state that the first, the third, the fifth and the seventh transistors are four PNP transistors, and the second, the fourth, the sixth and the eighth transistors are four NPN transistors.

13. A temperature compensating circuit according to claim 3, wherein:
- at least a portion of the reference current flows through the negative temperature coefficient resistor;
- the resistance circuit further comprises a positive-temperature-coefficient resistor;
- a preset connection combination of the negative-temperature-coefficient and the positive-temperature-coefficient resistors is formed between the first and the second terminals of the resistance circuit;
- the temperature compensating circuit further utilizes the positive-temperature-coefficient resistor to compensate the second output signal for the temperature change; and
- the preset connection combination is one of a series connection combination and a parallel connection combination.

14. A temperature compensating method, comprising steps of:
- converting a reference current into a first bias-voltage signal by a resistance circuit and a first transistor, wherein:
  the resistance circuit has a first terminal receiving the reference current, a second terminal and a negative-temperature-coefficient resistor,
  the first transistor has a drain, a source, a gate and a path disposed between the drain and the source,
  the path of the first transistor is connected in series with the resistance circuit, and
  the gate of the first transistor is electrically connected to the drain of the first transistor and the second terminal of the resistance circuit;
- producing a first output signal having a variable frequency in response to the first bias-voltage signal;
- converting the first bias-voltage signal into a first current by a second transistor, wherein the first and the second transistors constitute a first current mirror, and the first current is proportional to the reference current;
- converting the first current into a second bias-voltage signal by a third transistor;
- converting the first bias-voltage signal into a second current by a fourth transistor, wherein the first and the fourth transistors constitute a second current mirror, and the second current is proportional to the reference current and is a first factor of producing the variable frequency of the first output signal; and
- utilizing the negative-temperature-coefficient resistor to compensate the variable frequency of the first output signal for a temperature change.

15. A temperature compensating method according to claim 14, wherein
the first current is a factor of producing the variable frequency of the first output signal.

16. A temperature compensating method according to claim 14, wherein:
at least a first portion of the reference current flows through the negative-temperature-coefficient resistor;
the first output signal is produced by a ring oscillator; and
the variable frequency is an oscillation frequency of the ring oscillator.

17. A temperature compensating method according to claim 14, further comprising a step of:
converting the second bias-voltage signal into a third current by a fifth transistor, wherein the third and the fifth transistors constitute a third current mirror, and the third current is proportional to the first current and is a second factor of producing the variable frequency of the first output signal.

18. A temperature compensating method according to claim 17, wherein the first, the second, the third, the fourth, and the fifth transistors are in a specific state, and the specific state is one selected from a group consisting of:
a first state that the first, the second and the fourth transistors are three NMOS transistors, and the third and the fifth transistors are two PMOS transistors; and
a second state that the first, the second and the fourth transistors are three NPN transistors, and the third and the fifth transistors are two PNP transistors.

19. A temperature compensating method according to claim 17, wherein the first, the second, the third, the fourth, and the fifth transistors are in a specific state, and the specific state is one selected from a group consisting of:
a first state that the first, the second and the fourth transistors are three PMOS transistors, and the third and the fifth transistors are two NMOS transistors; and
a second state that the first, the second and the fourth transistors are three PNP transistors, and the third and the fifth transistors are two NPN transistors.

20. A temperature compensating method according to claim 14, further comprising a step of:
utilizing a positive-temperature-coefficient resistor to compensate the first output signal for the temperature change, wherein the positive-temperature-coefficient and the negative-temperature-coefficient resistors constitute the resistance circuit in a preset connection combination, and the preset connection combination is one of a series connection combination and a parallel connection combination.

* * * * *